(12) United States Patent
Tadepalli et al.

(10) Patent No.: US 10,481,206 B2
(45) Date of Patent: Nov. 19, 2019

(54) AUTOMATIC TEST EQUIPMENT (ATE) PLATFORM TRANSLATION

(71) Applicant: TEXAS INSTRUMENTS INCORPORATED, Dallas, TX (US)

(72) Inventors: Ramana Tadepalli, McKinney, TX (US); Robert Gabriel Almendarez, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 183 days.

(21) Appl. No.: 15/259,936

(22) Filed: Sep. 8, 2016

(65) Prior Publication Data

US 2018/0067161 A1    Mar. 8, 2018

(51) Int. Cl.
*G01R 31/317* (2006.01)
*G01R 31/00* (2006.01)
*G01R 31/319* (2006.01)

(52) U.S. Cl.
CPC ... *G01R 31/31908* (2013.01); *G01R 31/3191* (2013.01); *G01R 31/31919* (2013.01)

(58) Field of Classification Search
None
See application file for complete search history.

(56) References Cited

U.S. PATENT DOCUMENTS

| 2004/0181731 A1* | 9/2004 | Rajsuman | G06F 11/263 714/747 |
| 2010/0235135 A1* | 9/2010 | Conner | G01R 31/31919 702/119 |
| 2012/0293195 A1* | 11/2012 | Bourstein | G01R 31/31721 324/750.01 |
| 2012/0324302 A1* | 12/2012 | Arslan | G01R 31/318572 714/727 |
| 2013/0227367 A1* | 8/2013 | Czamara | G01R 31/3177 714/735 |
| 2014/0189430 A1* | 7/2014 | Hilliges | G01R 31/2834 714/27 |
| 2014/0236526 A1* | 8/2014 | Frediani | G01R 31/2834 702/119 |
| 2016/0238657 A1* | 8/2016 | Czamara | G01R 31/2834 |
| 2016/0245858 A1* | 8/2016 | Bosques | G01R 31/2834 |

* cited by examiner

*Primary Examiner* — Justin R Knapp
(74) *Attorney, Agent, or Firm* — Ronald O. Neerings; Charles A. Brill; Frank D. Cimino

(57) ABSTRACT

A system that can include a computing device, upon implementing a host test program, can be configured to generate compiled host test instructions based on a non-host test program code that has been prepared in accordance with performance characteristics of a non-host automatic test equipment (ATE) and based on calibration data and/or offset data associated with a host ATE. The system can further include a hardware adapter that can be configured to generate non-host test signals based on host test signals generated by a host ATE and with substantially similar characteristics as test signals generated by the non-host ATE, wherein the host test signals are generated by the host ATE based on the compiled host test instructions.

20 Claims, 2 Drawing Sheets

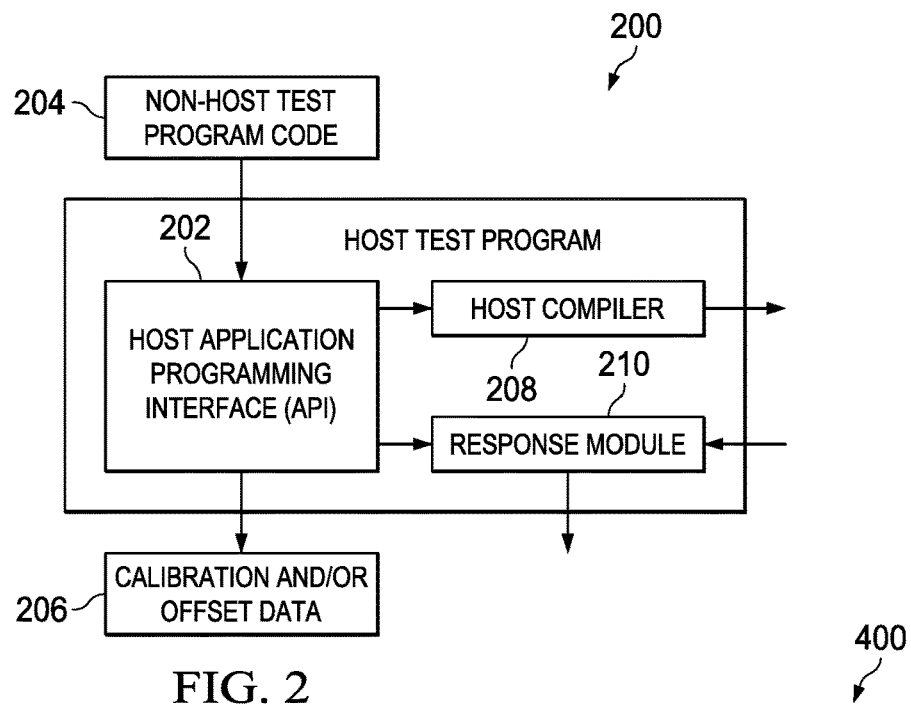
FIG. 2
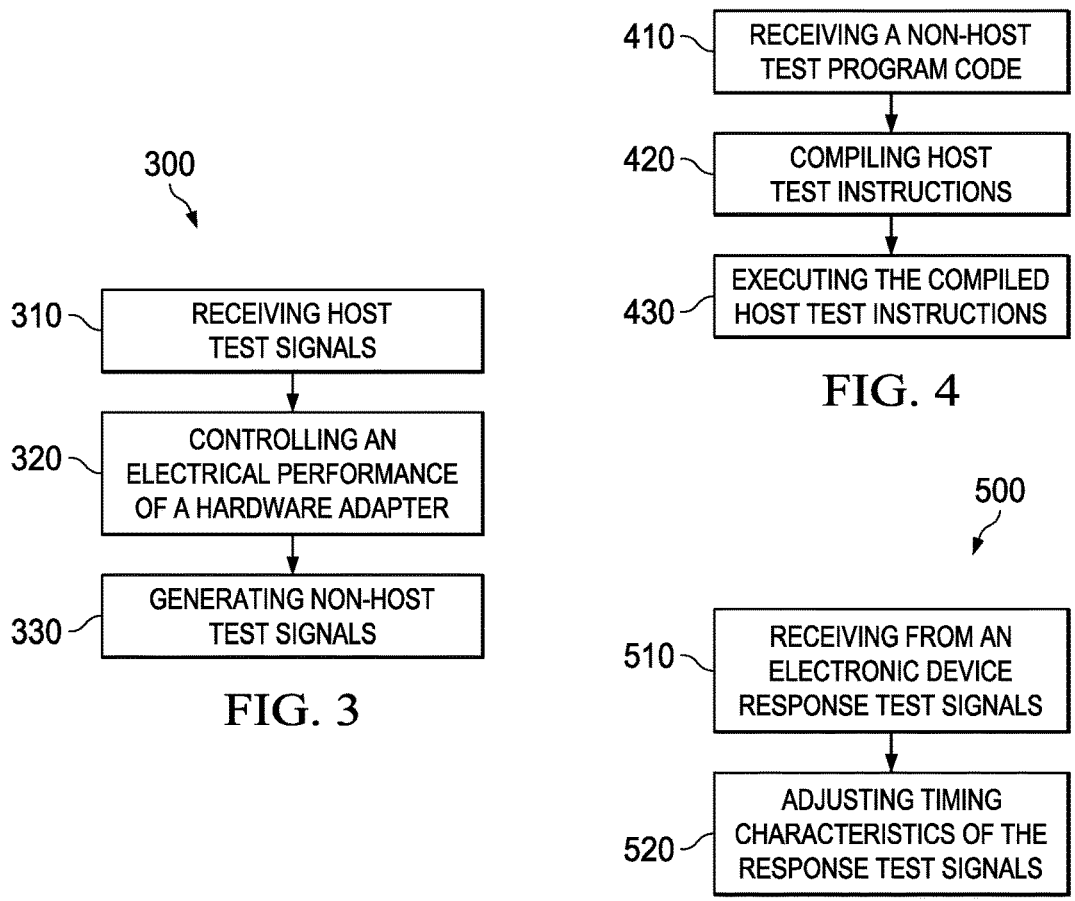
FIG. 3
FIG. 4
FIG. 5

AUTOMATIC TEST EQUIPMENT (ATE) PLATFORM TRANSLATION

TECHNICAL FIELD

This disclosure relates to test systems, more particular to a system and method for testing electronic devices.

BACKGROUND

To ensure reliability and functionality of integrated semiconductor based devices (e.g., memory devices such as dynamic random-access memory (DRAM), a microprocessor, an analog-to-digital (A/D) converter, a digital-to-analog (D/A) converter, electromagnetic devices such as laminate transformers, optical devices such as light emitting diodes (LEDs), micro-electromechanical systems (MEMS) such as gyroscopic sensors, radio frequency (RF) devices such as bulk acoustic wave filters, etc.), it is common practice for manufacturers to test these devices using a testing system, such as automatic test equipment (ATE).

To test these devices, manufacturers often developed custom test programs. Applying the custom test programs to the devices prior to shipping ensures that defective or under-performing devices are identified and removed. Manufacturers have expended extensive resources (money and time) in developing these test programs. Each test program has been prepared to operate on a selected ATE platform to verify an operation and/or performance of a specific device.

Throughout the years, testing equipment suppliers have replaced older ATEs with newer equipment. As a result, test equipment suppliers have discontinued providing support for these ATEs, such as hardware and software support. Although test equipment suppliers cease providing support for these ATEs, device manufacturers continue to utilize these ATEs to test these devices. Over an ATE's lifetime, the ATE is likely to experience hardware failures and software bugs, which if not addressed, will render the ATE inoperable. Thus, a manufacturer may have to develop a different solution to test the devices, which can be costly and inefficient.

SUMMARY

One example relates to a system that can include a computing device, which can upon implementing a host test program, can be configured to generate compiled host test instructions based on a non-host test program code that has been prepared in accordance with performance characteristics of a non-host automatic test equipment (ATE) and based on calibration data and/or offset data associated with a host ATE. The system can further include a hardware adapter that can be configured to generate non-host test signals based on host test signals generated by a host ATE based on the compiled host test instructions with substantially similar characteristics as test signals generated by the non-host ATE. The system can further include a device that can receive the non-host test signals to verify an operation and/or performance of the device.

Another example relates to a method that can include receiving, at a hardware adapter, host test signals from a host ATE. The host test signals can be generated based on machine code compiled from a non-host test program code that has been prepared in accordance with performance characteristics of a non-host ATE and based on calibration and/or offset data associated with the host ATE. The method can further include controlling an electrical performance of the hardware adapter based on the host test signals. The hardware adapter can be configured to match, within a predetermined tolerance an electrical performance of the non-host ATE and generating, at the hardware adapter, non-host test signals based on the electrical performance of the hardware adapter.

A further example relates to a method that can include receiving, at a hardware adapter response signals from a device based on non-host test signals applied to a device. The host test signals can be generated based on host test signals provided by a host ATE, which can be generated based on machine code compiled from a test program code that has been prepared in accordance with performance characteristics of a non-host ATE. The method can further include adjusting timing characteristics of the response signals based on calibration data and/or offset data to compensate for a propagation delay of the hardware adapter to generate calibrated response signals.

BRIEF DESCRIPTION OF THE DRAWINGS

FIG. 2 illustrates an example of a host test program.

FIG. 3 illustrates an example of a flowchart of a method for generating non-host test signals at a hardware adapter for verifying an operation and/or performance of an ATE tested device.

FIG. 4 illustrates an example of a flowchart of a method for generating host test signals at a host ATE that can control an electrical performance of a hardware adapter for verifying an operation and/or performance of an ATE tested device.

FIG. 5 illustrates an example of a flowchart of a method for processing response test signals from an ATE tested device at a hardware adapter.

DETAILED DESCRIPTION

Figure 1:
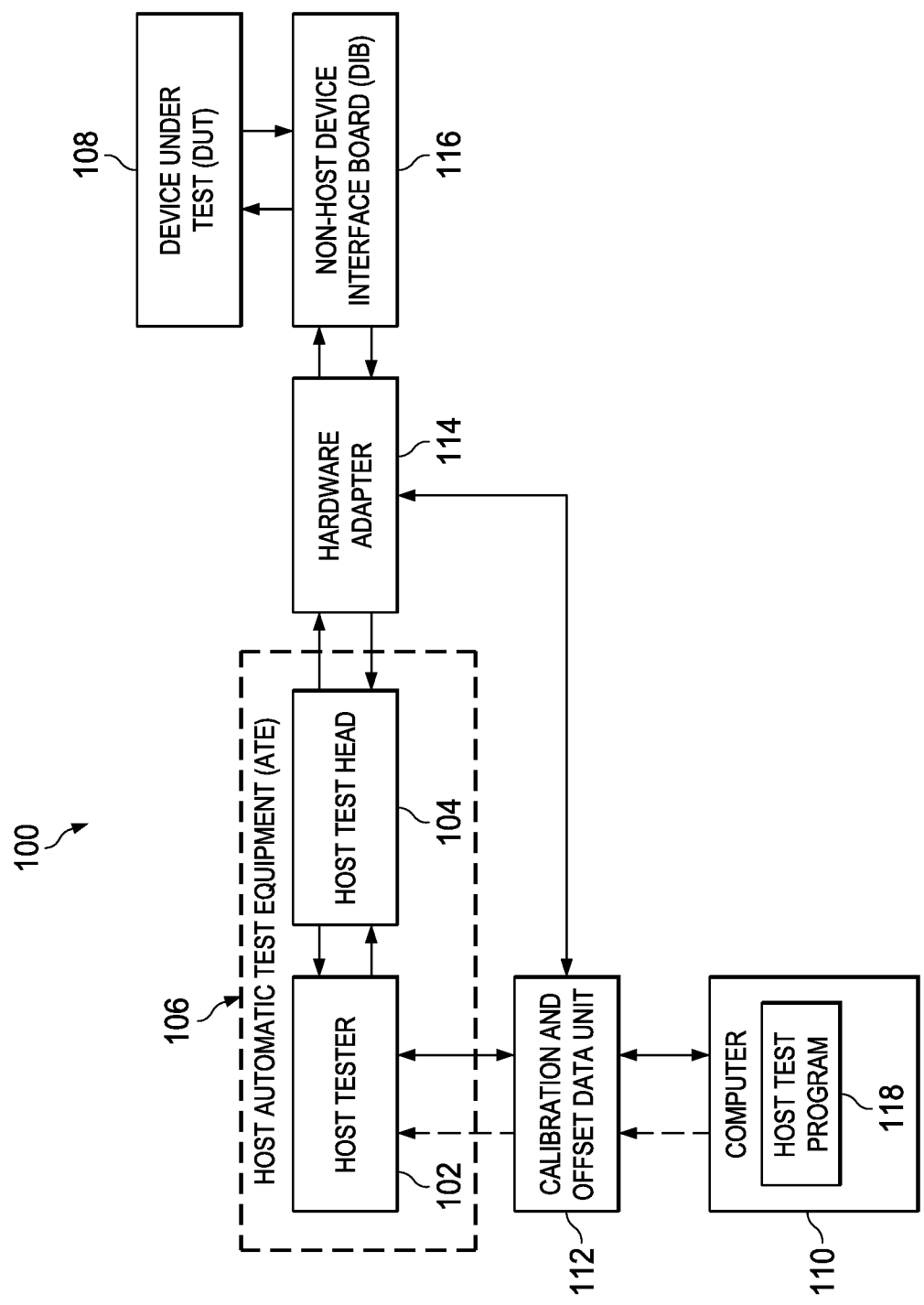
FIG. 1 illustrates an example of a test system for verifying an operation and/or performance of an automatic test equipment (ATE) tested device.

Systems and methods described herein that can be employed for testing devices using a host automatic test equipment (ATE). The systems and methods described herein can employ software and/or hardware that enable a manufacturer of devices to verify an operation and/or performance of these devices using the host ATE based on a test program that has been prepared in accordance with performance characteristics of a non-host ATE. Thus, the systems and methods described herein enable manufacturers to test the devices on the host ATE while using non-host test program code.

The host ATE can be configured to compile host test signals corresponding to host test instructions, which are native to the host ATE, based on the non-host test program code and based on calibration and offset data. The host test signals can be executed on a hardware adapter to generate non-host test signals corresponding to one or more tests that can be applied to verify the operation and/or performance of an ATE tested device. The hardware adapter can be configured to generate test signals that can have substantially similar characteristics (e.g., electrical, optical, magnetic, RF, signal strength, signal level, signal speed, signal purity, etc.) as test signals generated by the non-host ATE (i.e., match an electrical performance of the non-host ATE). Thus, the hardware adapter can be configured to transform the host ATE into behaving substantially similar as the non-host ATE. Accordingly, the host ATE can be adapted to match an operational performance of the non-host ATE.

The hardware adapter can be configured to function as a communication bridge between the host ATE and a non-host device interface board (DIB) to which the ATE tested device can be coupled. The non-host DIB can be configured to supply the ATE tested device with the non-host test signals. The ATE tested device can be configured to generate non-host response signals based on the non-host test signals. The hardware adapter can be configured to receive the non-host response signals and transform the non-host response signals based on the calibration and offset data. The transformed non-host response signals can be supplied to a computer via the host ATE for processing. Alternatively, the hardware adapter can pass the non-host response signals to the computer for transformation.

FIG. 1 illustrates an example of a test system 100 that can verify an operation and/or performance of an ATE tested device. The test system 100 can be configured to test the electronic device by applying one or more tests to the electronic device. The test system 100 can include a host tester 102 and a host test head 104, which can collectively form a host ATE 106. The host ATE 106 can correspond to an ATE manufactured by Teradyne™, ABI Electronics™, Agilent Technologies™, Chroma™, Diagnosys™, Keysight™, ProT Ar-Ge™, Qmax Test™ or an equivalent manufacture thereof. A given ATE tested device that can be tested by the host ATE 106 is referred to herein to as a device under test (DUT) 108. The DUT 108 can include at least one of a memory device (e.g., an integrated circuit (IC) chip), such as a dynamic random-access memory (DRAM) module, a microprocessor, an analog-to-digital (A/D) converter, a digital-to-analog (D/A) converter, electromagnetic devices such as laminate transformers, optical devices such as light emitting diodes (LEDs), micro-electromechanical systems (MEMS) such as gyroscopic sensors, radio frequency (RF) devices such as bulk acoustic wave filters, etc.

The test system 100 can include a computer 110 having memory that can include non-host test program code that has been prepared in accordance with a non-host ATE for verifying the operation and/or performance of the DUT 108. Alternatively, the computer 110 can be part of the host ATE 106. The non-host test program code can include one or more test instructions that can be executed by the non-host ATE to generate non-host test signals that can have particular signal characteristics (e.g., voltage levels, current levels, timings, etc.) to verify the operation and/or performance of the DUT 108. The term "host", as used herein, is a modifier relating to at least a comparable, commensurate, incompatible with or newer than terms that employ the modifier "non-host" or legacy. Thus, the host ATE 106 can be a successor to the non-host ATE.

The computer 110 can include a host test program 118 that can be programmed to control low-level operations (e.g., machine code operations) of the host ATE 106. The host test program 118 can be programmed to compile host test instructions based on the non-host test program code and based on calibration data and/or offset data values from a calibration and offset data unit 112 of the test system 100. The calibration and offset data unit 112 can be implemented for example as a combination of hardware and software. In some examples, the calibration and offset data unit 112 can be implemented as a hardware device (e.g., an interface card) logically coupled as interface between the computer 110 and the host ATE 106. Additionally, the calibration and offset data unit 112 can be configured to communicate with a hardware adapter 114 of the system 100. The calibration and offset data unit 112 can be configured to calibrate the host ATE to generate calibration data and/or offset data. For example, the calibration and offset data unit 112 can be configured to measure a propagation delay (offset) of signals traversing components of the system 100 and store/provide offset values characterizing the propagation delay.

The host ATE 106 can be configured to execute the compiled host test instructions to control the host ATE 106 to generate host test signals at an output of the host ATE 106. The host test program 118 can be programmed to insert one or more hooks into the host test signal. The hardware adapter 114 can be configured to execute the one or more hooks. Execution of the one or more hooks can cause the hardware adapter 114 to fetch one or more calibration and/or offset data values from an associated location in the calibration and offset data unit 112. The hardware adapter 114 can be configured to insert the fetched one or more calibration and/or offset data values into the non-host test signals such that the non-host test signals can have substantially similar characteristics, including signaling and/or timing characteristics, as test signals generated by the non-host ATE. The term "substantially similar" as used herein refers to within a predetermined tolerance or a predetermined threshold (e.g., 1-5%). Thus, the hardware adapter 114 can be configured to generate non-host test signals that match/resemble within a predetermined tolerance test signals generated by the non-host ATE.

The non-host test program code can include a test or series of tests that can be applied to the DUT 108. The test or series of tests applied to the DUT 108 can include a direct current (DC) parametric test, an alternating current (AC) parametric test and/or a functional test. The DC parametric test can be employed by the host test program 118 to verify DC characteristics of the DUT 108 (e.g., input and output impedance, leakage current, etc.). The AC parametric test can be employed by the host test program 118 to verify a speed and performance of the DUT 108. The functional test can be employed by the host test program 118 to verify an operation of electrical components (e.g., wires, semiconductors, etc.) of the DUT 108.

The hardware adapter 114 can be configured to interface with a non-host DIB 116 of the system 100. The hardware adapter 114 can be configured to enable the host ATE 106 to communicate with the DUT 108 via the non-host DIB 116. The non-host DIB 116 can be configured to interface with the DUT 108 and supply the DUT 108 with the non-host test signals received from the hardware adapter 114. The non-host DIB 116 can be configured to relay the non-host test signals to corresponding input pin(s) of the DUT 108 to stimulate the DUT 108.

The hardware adapter 114 can also be configured to interface with the host ATE 106 and receive the host test signals. The hardware adapter 114 can include signal generation circuitry, timing circuitry, radio-frequency (RF) piping, a relay board, cabling, a translation tower, optical generation circuitry, magnetic generation circuitry and mechanical stimulation circuitry, e.g., for piezoelectric devices or a combination thereof. In one example, the hardware adapter 114 can be configured to retrieve from the calibration and offset data unit 112 the one or more calibration and/or offset data values based on the one or more hooks of the host test signals. Additionally, based on the one more calibration and/or offset data values, the hardware adapter 114 can be configured to employ the circuitry to transform the host test signals into non-host test signals that have substantially similar characteristics (e.g., electrical, optical, magnetic, RF, signal strength, signal level, signal speed, signal purity, etc.), as the test signals generated by the host-ATE. Thus, the hardware adapter 114 can adjust the characteristics of the host test signals at the hardware level.

Additionally or alternatively, the characteristics of the host test signals can be adjusted at the software level. The host test program 118 operating on the computer 110 can be programmed to adjust characteristics of the host test signals generated at an output of the host ATE 106 based on the non-host test program code and based on one or more calibration and/or offset values from the calibration and offset data unit 112. The hardware adapter 114 can be provided with host test signals having adjusted characteristics corresponding to the non-host test signals to the non-host DIB 116 such that the non-host DIB 116 can test the DUT 108 in response to the adjusted host test signals. The non-host DIB 116 can pass through the adjusted host test signals to stimulate the DUT 108.

In one example, the transformation can further include adjusting timing characteristics of the host test signals such that the non-host test signals have timing characteristics that substantially resemble timing characteristics of the test signals generated by the non-host ATE. In one example, the host ATE 106 can be substantially faster at processing test instructions in contrast to the non-host ATE. In another example, the host ATE 106 can be substantially slower at processing test instructions in contrast to the non-host ATE. In either example, the hardware adapter 114 can be configured to adjust the timing characteristics of the host test signals based on the one or more retrieved calibration and/or offset data values such that the non-host test signals have timing characteristics that substantially reflect timing characteristics of the test signals generated by the non-host ATE.

In another example, the DUT 108 can be designed and fabricated to receive test signaling with a specified rise time (e.g., timing characteristic) based on the non-host test program code. In response to the test signaling, the DUT 108 can be configured to generate response signals within a desired response time. To enable the host ATE 106 to generate test signaling with the specified rise time, the host test program 118 can be programmed to control the hardware adapter 114 based on the host test program code and based on the one more calibration and/or offset values to modify the timing characteristics of the host test signals. The hardware adapter 114 can be configured to adjust the timing characteristics of the host test signals such that the non-host test signals generated by the hardware adapter can include the specified rise time. Thus, the hardware adapter 114 can "slow down" the host test signals such that the non-host test signals can have timing characteristics that substantially resemble the timing characteristics of the test signals generate by the non-host ATE.

In an even further example, the host test program 118 can be programmed to adjust timing characteristics of the host test signals at a software level such the hardware adapter 114 can be provided with host test signals that can have timing characteristics that substantially resemble the timing characteristics of the test signals generate by the non-host ATE. Thus, the timing characteristics of the host test signals can be adjusted at one of the hardware or software level.

Additionally, the calibration and offset data unit 112 can be configured to apply a calibration test to the host ATE 106 and the hardware adapter 114. The calibration and data offset unit 112 can be configured to apply calibration signaling to the host ATE 106 and the hardware adapter to determine a signal propagation delay of the ATE 106 and the hardware adapter 114. The calibration and offset data unit 112 can be configured to determine a signal propagation delay, for example, of the hardware adapter 114. The calibration and offset data unit 112 can be configured to store a value corresponding to a negative offset value representative of the signal propagation delay in memory of the calibrating and/or offset data unit 112. The DUT 108 can be configured to generate the non-host response signals (e.g., currents, voltages and light signals) based on the non-host test signals at corresponding output pins of the DUT 108. In one example, the hardware adapter 114 can be configured to pass the non-host response signals to the host test program 118. To compensate for the signal propagation delay between the non-host DIB 116 and the host ATE 106, the host test program 118 can be programmed to perform a timing transformation. The timing transformation can include adjusting timing characteristics of the non-host response signal to compensate for the signal propagation delay between the non-host DIB 116 and the host ATE 106 based on the negative offset time value from the calibration and offset data unit 112. Accordingly, the negative offset time value can compensate for a time delay of the hardware adapter 114. In another example, the hardware adapter 114 can be configured to receive the non-host response signals from the non-host DIB 110, receive the negative offset time value from the calibration and offset data unit 112 and perform the timing transformation on the non-host response signals based on the negative offset time value.

In an even further example, the hardware adapter 114 can be configured to expand a functionality of the host ATE 106 such that the host ATE 106 can provide one or more additional test functions that the host ATE 106 does not natively support. In one example, the non-host test program code prepared for the non-host ATE can include one more tests that the host ATE 106 does not natively support/provide. The hardware adapter 114 can include circuitry such as a relay matrix, a timing circuit, a delay circuit, a data converter circuit, a servo loop circuit, an analog-to-digital converter (ADC), a phase-locked loop (PLL) circuit and/or a clock cleaning circuit that can be controlled to provide the one or more additional test functions. Thus, the hardware adapter 114 can be configured to expand the operational capabilities of the host ATE 106 to enable the host ATE 106 to perform the one or more additional test functions of the non-host ATE.

Still further, the hardware adapter 114 can further be configured to modify a resolution of the host ATE 106 to substantially match the resolution of the non-host ATE, such that the host ATE 106 can sample at a substantially similar sampling rate as the non-host ATE response signaling from the DUT 108. For example, if the host ATE 106 is not able to perform a sixteen (16) bit measurement, the hardware adapter 114 can include a 16-bit ADC that can provide a 16-bit sample of the non-host response signals. Thus, the hardware adapter 114 can configure the host ATE 106 to match the resolution of the non-host ATE.

Implementing the host ATE 106 with the hardware adapter 114, a manufacturer can continue verifying the operation and/or performance of the DUT 108 using an existing test program and the non-host DIB 116. Thus, by implementing the host test program 118 and the hardware adapter 114 the need to develop new host test program code that is compatible with the host ATE 106 and a new host DIB would be obviated. Instead, the manufacturer can continue utilizing the host ATE 106 to verify the operation and/or performance of the DUT 108 via the non-host DIB 116.

As noted, the hardware adapter 114 can be designed/configured to transform the host ATE 106 to match an electrical performance of the non-host ATE. Accordingly, in some examples, the hardware adapter 114 can be configured to transform the host ATE 106 such that the host ATE 106 is capable of additional functionality beyond that which the host ATE 106 is designed to perform. Furthermore, from the point of view of the DUT 108, it seems that the DUT 108 is being supplied with non-host test signals from the non-host ATE when in reality the non-host test signals are being supplied by via the hardware adapter 114 from the host ATE 106. Accordingly, the hardware adapter 114 enables the manufacturer to test the DUT 108 on the host ATE 106 using test program code designed and prepared in accordance with performance characteristics of the non-host ATE. Such an approach eliminates the need for a full-scale conversion.

A full-scale conversion would require that the manufacturer (or a third party) design and develop a new host DIB that can be configured to interface with the DUT 108, interpret the non-host test program code prepared based on the non-host ATE (i.e., understand line by line non-host test instructions) and prepare host test program code for the host ATE 106. However, such a solution is financially cost prohibitive and requires weeks or months of research to design the new host DIB and develop the host test program code. To overcome the drawbacks of utilizing the full-scale conversion to test the DUT 108, the host ATE 106 can be interfaced with the hardware adapter 114 and controlled based on the see-host test program 118 to match an electrical performance of the non-host ATE. The non-host test signals provided by the hardware adapter 114 can have substantially similar characteristics as test signals provided by the non-host ATE.

FIG. 2 illustrates an example of a host test program 200. In one example, the host test program 200 can correspond to the host test program 118, as described in context of FIG. 1. The host test program 200 can be installed on a computer (e.g., COMPUTER 110, as illustrated in FIG. 1) or on a host ATE (e.g., HOST ATE 106, as illustrated in FIG. 1). The host test program 200 can include a host application programming interface (API) 202. The host API 202 can retrieve a non-host test program code 204 from memory. In one example, the host test program code 204 can be stored in memory of the computer. In another example, the host API 202 can communicate with an external server to retrieve the host test program code 204 stored locally on the external server. The non-host test program code 204 can correspond to test code that has been prepared based on performance characteristics of a non-host ATE. The non-host test program code 204 can include one or more tests corresponding to one or more non-host test statements that can be executed on the non-host ATE to verify the operation and/or performance of a corresponding DUT (e.g., DUT 108, as illustrated in FIG. 1).

The host test program 200 can be programmed to retrieve calibration and/or offset data 206 from a calibration and offset data unit (e.g., CALIBRATION AND OFFSET DATA UNIT 112, as illustrated in FIG. 1). The calibration and/or offset data can include one or more calibration and/or offset data values that can include a voltage offset value, a current offset value, a positive time delay offset value, a negative time delay offset value, an electrical path length value, an accuracy error value, a path resistance value, etc. The host test program 200 can further include a host compiler 208. The host API 202 can be programmed to control the host compiler 208 based on the non-host test program code 204 and based on the calibration and/or offset data 206 to generate host test instructions. The host test instructions can be supplied to the host ATE to generate host test signals. The host test signals can be received by a hardware adapter (e.g., HARDWARE ADAPTER 114, as illustrated in FIG. 1) and transformed by the hardware adapter into non-host test signals that have similar characteristics as test signals generated by the non-host ATE.

In one example, the compiler 208 can be programmed to compile host test instructions that can include one or more inserted hooks. The one or more inserted hooks can be executed to fetch one or more corresponding calibration and/or offset data values from an appropriate address location in the calibration and offset data unit. The host API 202 can be programmed to control the compiler 208 to insert one or more hooks that can include a corresponding location identifier specifying a respective address location within the calibration and offset data unit for retrieving a respective calibration or offset value. The compiled host test instructions can be supplied to control the host ATE to generate host test signals that include information corresponding to the one or more inserted hooks. During transformation, the hardware adapter can retrieve the respective calibration and offset values based on the one or more inserted hooks and generate the non-host test signals with characteristics that substantially resemble the test signals generated by the non-host ATE.

In another example, the host API 202 can be programmed to control the host compiler 208 to read the calibration and offset data 206 and adjust the characteristics of the host test instructions and consequently the host test signals at a software level. Thus, by adjusting the characteristics of the host test signals at the software level rather than at a hardware level, reduces (if needed) any additional adjusting of the characteristics of the host test signals at the hardware adapter to generate the non-host test signals.

The host test program 200 can further include a response module 210. The response module 210 can be programmed to receive response signals from the host ATE. The response signals can correspond to non-host response signals generated by the DUT based on the non-host response signals provided by the hardware adapter. The host API 202 can be programmed to control the response module 210 based on the calibration and/or offset data 206 to adjust, for example, timing characteristics of the non-host response signals.

In a further example, the host API 202 can be programmed to control the response module 210 to compensate for a signal propagation delay between a non-host DIB (e.g., NON-HOST DEVICE INTERFACE BOARD (DIB) 116, as illustrated in FIG. 1) and the host ATE. The host API 202 can be programmed to retrieve from the calibration and/or offset data 206 a negative time offset value corresponding to a time value representing the signal propagation delay between the non-host DIB and the host ATE. The response module 210 can be programmed to receive the negative time offset value from the host API 202 and adjust the non-host response signals to compensate for a time delay of the hardware adapter.

In view of the foregoing structural and functional features described above, example methodologies will be better appreciated with reference to FIGS. 4 and 5. While, for purposes of simplicity of explanation, the example methods of FIGS. 4 and 5 are shown and described as executing serially, it is to be understood and appreciated that the present examples are not limited by the illustrated order, as some actions could in other examples occur in different orders and/or concurrently from that shown and described herein.

FIG. 3 illustrates an example of a flowchart of a method for generating non-host test signals at a hardware adapter for verifying an operation and/or performance of a device, such as DUT (e.g., DEVICE UNDER TEST (DUT) 108 illustrated in FIG. 1). At 310, a hardware adapter (e.g., HARDWARE ADAPTER 114, as illustrated in FIG. 1) can be configured to receive host test signals from a host ATE (e.g., HOST ATE 106, as illustrated in FIG. 1). The host test signals can be generated based on machine code compiled from a non-host test program code that has been prepared in accordance with performance characteristics of a non-host ATE and based on calibration and/or offset data. At 320, the electrical performance of the hardware adapter can be controlled based on the host test signals such that the hardware adapter can match an electrical performance of the non-host ATE. At 330 the non-host test signals can be generated at the hardware adapter to stimulate an electronic device based on the electrical performance of the hardware adapter. The hardware adapter can be controlled such that characteristics of the non-host test signals substantially can resemble characteristics of test signals generated by the non-host ATE.

FIG. 4 illustrates an example of a flowchart of a method for generating host test signals at a host ATE (e.g., HOST ATE 106, as illustrated in FIG. 1) that can control an electrical performance of a hardware adapter (e.g., HARDWARE ADAPTER 114, as illustrated in FIG. 1). At 410, an API (e.g., HOST APPLICATION PROGRAMMING INTERFACE (API) 202, as illustrated in FIG. 1) can be programmed to receive a non-host test program code (e.g., NON-HOST TEST PROGRAM CODE 204, as illustrated in FIG. 2) that has been prepared based on performance characteristics of a non-host ATE and calibration data and/or offset data (e.g., CALIBRATION AND/OR OFFSET DATA 206, as illustrated in FIG. 2). The non-host test program code can include one or more non-host test statements that can be executed on the non-host ATE. At 420, a host compiler (e.g., HOST COMPILER 208, as illustrated in FIG. 1) can be controlled to compile host test instructions for execution on the host ATE based on the non-host test program code and based on the calibration data and/or offset data. The compiler can insert one or more hooks that can include a corresponding location identifier specifying a respective address location within the calibration data and offset data for retrieving a respective calibration or offset value. At 430, the host test instructions can be executed on the host ATE to generate host test signals. The host test signals can be employed to control an electrical performance of a hardware adapter (e.g., HARDWARE ADAPTER 114, as illustrated in FIG. 1) such that the hardware adapter matches an electrical performance of the non-host ATE.

FIG. 5 illustrates an example of a flowchart of a method for processing response test signals at a hardware adapter (e.g., HARDWARE ADAPTER 114, as illustrated in FIG. 1). At 510, the hardware adapter can be configured to receive from a device (e.g., DUT 108, as illustrated in FIG. 1) response signals based on non-host test signals applied to the device (e.g., DEVICE UNDER TEST (DUT) 108 illustrated in FIG. 1). The non-host test signals can be generated based on host test signals provided by a host ATE (e.g., HOST ATE 106, as illustrated in FIG. 1). The host test signals can be generated based on machine code that can be compiled from a test program code that has been prepared in accordance with performance characteristics of a non-host ATE. At 520, timing characteristics of the response signals can be adjusted based on calibration and/or offset data (e.g., CALIBRATION AND/OR OFFSET DATA 206, as illustrated in FIG. 2) to compensate for a signal propagation delay of the hardware adapter to generate calibrated response signals.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims.

Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A system comprising:
a computer device, upon implementing a host test program, is configured to generate compiled host test instructions based on a non-host test program code prepared in accordance with performance characteristics of a non-host automatic test equipment (ATE) and based on calibration data and/or offset data associated with a host ATE; and
a hardware adapter configured to generate non-host test signals based on host test signals generated by the host ATE and with substantially similar characteristics as test signals generated by the non-host ATE, wherein the host test signals are generated by the host ATE based on the compiled host test instructions.

2. The system of claim 1, further comprising:
a device under test (DUT) configured to receive the non-host test signals to verify an operation and/or performance of the DUT.

3. The system of claim 2, wherein the DUT comprises at least one of a memory integrated circuit (IC) chip, a microprocessor, an analog-to-digital (A/D) converter, a digital-to-analog (D/A) converter, an electromagnetic device, an optical device, a micro-electromechanical system, and a radiofrequency (RF) device.

4. The system of claim 2, further comprising:
a device interface board (DIB) configured to receive the non-host test signals and stimulate appropriate input pins of the DUT based on the non-host test signals, wherein the hardware adapter is configured to interface with both the host ATE and the DIB.

5. The system of claim 1, further comprising:
a calibration and offset data unit configured to calibrate the host ATE to generate the calibration data and/or the offset data, wherein the calibration and offset data unit is further configured to store the calibration data and/or the offset data in memory,
wherein the calibration and/or the offset data comprises at least one of a voltage offset value, a current offset value, a positive time delay offset value, a negative time delay offset value, an electrical path length value, an accuracy error value and a path resistance value.

6. The system of claim 5, wherein calibrating the host ATE comprises applying calibration signaling to the host ATE and the hardware adapter to determine a signal propagation delay of the hardware adapter corresponding to the generated offset data.

7. The system of claim 2,
wherein the hardware adapter receives from the DUT response signals based on the non-host test signals; and
wherein at least one of the host test program and the hardware adapter adjusts timing characteristics of the response signals based on the calibration data and/or the offset data to compensate for a propagation delay of the hardware adapter to generate calibrated response signals.

8. A method comprising:
receiving, at a hardware adapter, host test signals from a host automatic test equipment (ATE), wherein the host test signals are generated based on machine code compiled from a non-host test program code that has been prepared in accordance with performance characteristics of a non-host ATE and based on calibration data and/or offset data associated with the host ATE;
controlling an electrical performance of the hardware adapter based on the host test signals, wherein the hardware adapter is configured to match, within a predetermined tolerance, an electrical performance of the non-host ATE; and
generating, at the hardware adapter, non-host test signals based on the electrical performance of the hardware adapter.

9. The method of claim 8, wherein the host test signals control the hardware adapter to generate non-host test signals that match signaling and/or timing characteristics of test signals generated by the non-host ATE.

10. The method of claim 8, further comprising:
compiling the non-host test program code based on the calibration data and/or the offset data to generate host test instructions corresponding to the machine code and; and
controlling the host ATE to generate the host test signals based on the compiled host test instructions.

11. The method of claim 10, further comprising:
inserting One of more hooks corresponding to One of fetch instructions for retrieving One of more calibration and/or offset data values corresponding to the calibration data and/or the offset data stored in memory.

12. The method of claim 8,
wherein the non-host test program code comprises One of more tests prepared in accordance with the non-host ATE for testing a device under test (DUT) in a manner that the host ATE does not support; and
wherein the electrical performance of the hardware adapter is controlled based on the host test signals to enable the host ATE to support the One of more tests based on the machine code.

13. The method of claim 8,
wherein the non-host test program code comprises a test prepared in accordance with the non-host ATE for stimulating a device under test (DUT) corresponding to verifying an operation and/or performance of the DUT; and
wherein the test comprises at least one of one of a direct current (DC) parametric test, an alternating current (AC) parametric test, a functional test.

14. The method of claim 13, wherein the DUT comprises at least one of a memory integrated circuit (IC) chip, a microprocessor, an analog-to-digital (A/D) converter, a digital-to-analog (D/A) converter, an electromagnetic device, an optical device, a micro-electromechanical system and a radio-frequency (RF) device.

15. The method of claim 8, wherein controlling an electrical performance of the hardware adapter comprises:
adjusting at least one of the characteristics of the host test signals based on the calibration data and/or the offset data,
wherein the adjusting is performed at one of at least one of a software level and a hardware level.

16. The method of claim 8, wherein the host ATE and the non-host ATE are configured to have different operational characteristics.

17. The method of claim 8, further comprising:
stimulating a device under test (DUT) based on the non-host test signals to cause the DUT to generate test response signals; and
adjusting timing characteristics of the test response signals based on the offset data to compensate for a propagation delay of the hardware adapter to generate calibrated test response signals.

18. The method of claim 17, wherein adjusting timing characteristics of the test response signals is performed at least one of at a software level and a hardware level.

19. A method comprising:
receiving, at a hardware adapter, response signals from a device based on non-host test signals applied to the device, wherein the non-host test signals are generated based on host test signals provided by a host automatic test equipment (ATE) and the host test signals are generated based on machine code compiled from a test program code that has been prepared in accordance with performance characteristics of a non-host ATE; and
adjusting timing characteristics of the response signals based on calibration data and/or offset data associated with the host ATE to compensate for a propagation delay of the hardware adapter to generate calibrated response signals.

20. The method of claim 19, wherein the adjusting timing characteristics of the response signals is performed at one of at a software level or a hardware level.

* * * * *